(12) United States Patent
Trimberger

(10) Patent No.: US 7,047,465 B1
(45) Date of Patent: May 16, 2006

(54) METHODS FOR USING DEFECTIVE PROGRAMMABLE LOGIC DEVICES BY CUSTOMIZING DESIGNS BASED ON RECORDED DEFECTS

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 500 days.

(21) Appl. No.: 10/085,305

(22) Filed: Feb. 28, 2002

(51) Int. Cl.
*G01R 31/28* (2006.01)

(52) U.S. Cl. .................................... 714/725
(58) Field of Classification Search ............. 714/725, 714/724, 726, 733; 326/10, 37, 39; 716/16
See application file for complete search history.

(56) References Cited

U.S. PATENT DOCUMENTS

| | | |
|---|---|---|
| 4,899,067 A | 2/1990 | So et al. |
| 5,153,880 A | 10/1992 | Owen et al. |
| 5,255,227 A | 10/1993 | Haeffele |
| 5,349,248 A | 9/1994 | Goetting et al. |
| 5,434,514 A | 7/1995 | Cliff et al. |
| 5,459,342 A | 10/1995 | Nogami et al. |
| 5,485,102 A | 1/1996 | Cliff et al. |
| 5,498,975 A | 3/1996 | Cliff et al. |
| 5,513,144 A | 4/1996 | O'Toole |
| 5,592,102 A | 1/1997 | Lane et al. |
| 5,742,556 A | 4/1998 | Tavrow et al. |
| 5,764,577 A | 6/1998 | Johnston et al. |

(Continued)

OTHER PUBLICATIONS

W. Bruce Culbertson, Rick Amerson, Richard J. Carter, Philip Kuekes, Greg Snider; "Defect Tolerance on the Teramac Custom Computer"; The 5th Annual IEEE Symposium on Field-Programmable Custom Computing Machines; Apr. 16-17, 1997, 1997; pp. 116-123.

(Continued)

*Primary Examiner*—Albert Decady
*Assistant Examiner*—James C. Kerveros
(74) *Attorney, Agent, or Firm*—Lois D. Cartier; LeRoy D. Maunu

(57) ABSTRACT

Methods for utilizing PLDs with localized defects. Each PLD has a unique identifier. In one embodiment, a PLD provider tests a series of PLDs, selecting those having localized defects and recording the location of each detected defect for each defective PLD in a defect database. On receiving an identifier from a user, the PLD provider provides to the user the location information for the defects associated with the identified PLD. The data can be received and provided, for example, over the Internet. In one embodiment, the PLD provider implements the design based on the defect locations and provides the resulting design file to the user. In some embodiments, an incremental compilation is performed. The methods of the invention can also be applied to other device-specific information, such as information on the speed of critical sub-components of the PLD.

9 Claims, 5 Drawing Sheets

U.S. PATENT DOCUMENTS

| | | | |
|---|---|---|---|
| 5,777,887 | A | 7/1998 | Marple et al. |
| 5,925,920 | A * | 7/1999 | MacArthur et al. ......... 257/530 |
| 6,166,559 | A * | 12/2000 | McClintock et al. ......... 326/10 |
| 6,167,558 | A | 12/2000 | Trimberger |
| 6,201,404 | B1 | 3/2001 | Reddy et al. |
| 6,289,292 | B1 * | 9/2001 | Charlton et al. ............ 702/108 |
| 6,292,925 | B1 | 9/2001 | Dellinger et al. |
| 6,344,755 | B1 | 2/2002 | Reddy et al. |
| 6,496,971 | B1 | 12/2002 | Lesea et al. |
| 6,560,740 | B1 | 5/2003 | Zuraski, Jr. et al. |
| 6,664,808 | B1 | 12/2003 | Ling et al. |
| 2001/0037458 | A1 | 11/2001 | Kean |

OTHER PUBLICATIONS

Fran Hanchek; Shantanu Dutt; "Node-Covering Based Defect and Fault Tolerance Methods for Increased Yield in FPGAs"; The Proceedings of the Ninth International Conference on VLSI Design; Jan. 1996.

Xilinx, Inc.; Virtex-II Platform FPGA Handbook'; published Dec. 6, 2000; available from Xilinx, Inc., 2100 Logic Drive, San Jose, California 95124; pp. 33-75.

U.S. Appl. No. 10/085,305, filed Feb. 28, 2002, Trimberger.
U.S. Appl. No. 10/714,380, filed Oct. 31, 2003, Trimberger.
U.S. Appl. No. 10/717,040, filed Nov. 18, 2003, Ngai et al.
U.S. Appl. No. 10/813,414, filed Mar. 26, 2004, Stassart et al.

John Emmert et al.; "Dynamic Fault Tolerance in FPGAs via Partial Reconfiguration"; Annual IEEE Symposium on Field-Programmable Custom Computing Machines; Apr. 17, 2000; pp. 165-174.

John M. Emmert et al; "Incremental Routing in FPGAs"; ASIC Conference 1998. Proceedings, Eleventh Annual IEEE International; Rochester, NY; Sep. 13-16, 1998; pp. 217-221.

Altera; Altera Data Sheet, vol. 1, Chapter 3 "Configuration and Testing"; and vol. 2 Chapter 8 "Remote System Upgrades with Stratix II Devices"; Feb. 2004; downloaded on Jun. 17, 2004 freom http://www.altera.com/literature/lit-stx2.

* cited by examiner

METHODS FOR USING DEFECTIVE PROGRAMMABLE LOGIC DEVICES BY CUSTOMIZING DESIGNS BASED ON RECORDED DEFECTS

FIELD OF THE INVENTION

The invention relates to programmable logic devices (PLDs). More particularly, the invention relates to methods for using defective PLDs that involve recording the defects of each PLD, accessing the recorded defect data, and generating a customized design file for each PLD that avoids the corresponding recorded defects.

BACKGROUND OF THE INVENTION

Programmable logic devices (PLDs) are a well-known type of integrated circuit that can be programmed to perform specified logic functions. For example, one type of PLD, the field programmable gate array (FPGA), typically includes a centrally-located array of configurable logic blocks (CLBs) surrounded by a ring of programmable input/output blocks (IOBs). The CLBs and IOBs are interconnected by a programmable interconnect structure.

Some advanced FPGAs include more than one type of logic block in the centrally-located array. For example, the Xilinx Virtex®-II FPGA includes blocks of Random Access Memory (RAM) and blocks implementing multiplier functions. (The Xilinx Virtex-II FPGA is described in detail in pages 33–75 of the "Virtex-II Platform FPGA Handbook", published January, 2001, available from Xilinx, Inc., 2100 Logic Drive, San Jose, Calif. 95124, which pages are incorporated herein by reference.)

The CLBs, IOBs, interconnect, and other logic blocks of an FPGA are typically programmed by loading a stream of configuration data (bitstream) into internal configuration memory cells that define how the logic blocks and interconnect are configured. The configuration data can be read from memory (e.g., an external PROM) or written into the FPGA by an external device. The collective states of the individual memory cells then determine the function of the FPGA.

FPGAs are called "field programmable" because the configuration data is written to the device each time the device is powered up (i.e., the device is programmed in the field). Other field programmable PLDs include CPLDs, for example, to which configuration data can be written once and the device remains configured until the configuration data is erased or overwritten. Thus, a CPLD can be programmed by the CPLD provider, the customer, or both. Other field programmable PLDs can include, but are not limited to, anti-fuse and fuse devices.

On the other hand, mask programmable devices such as Application Specific ICs (ASICs) are programmed by the ASIC manufacturer, by adding one or more customized metal layers as part of the semiconductor manufacturing process. Therefore, mask programmable devices are not field programmable.

As with any other integrated circuit, a field programmable PLD can include manufacturing defects. A defect too small to see can render a PLD completely or partially nonfunctional. PLD technology trends include rapidly increasing logic density. Thus, a tiny defect is more and more likely to impinge on active logic on the silicon surface of a die. Another important trend is a rapid increase in die size. As PLDs increase in size, the likelihood of a given die including a defect increases dramatically.

If a PLD die contains a single defective resource (e.g., if one of the configuration memory cells in an FPGA is defective), the PLD can render a user's end product unusable, because the user design might need to use that defective resource. To avoid problems with customers, a PLD provider generally discards a PLD if it contains even one defect that affects the active logic. Thus, a natural consequence of the increases in PLD size and density is an increase in the percentage of defective die, or a decrease in product yield. (The words "PLD provider", as used herein, refer to an entity that designs, manufactures, or distributes a PLD, as well as to an entity that performs two or more of these functions. For example, many FPGA providers design but do not actually manufacture their own FPGAs.)

The problem of low yield has significant economic impact on PLD providers. There are two types of defects: gross defects (which cause the failure of an entire PLD) and localized defects (which cause the failure of small portions of the PLD circuitry). It has been estimated that close to two thirds of large FPGA dice are discarded because of localized defects. Therefore, it is desirable to provide methods for using field programmable PLDs having localized defects to implement user designs.

One known method for using defective PLDs is to sort out those PLDs that are defective only in an isolated function. For example, an FPGA provider can set aside all of those FPGAs in which only the block RAM is defective. If a user design does not use the block RAM, the design will still function correctly when implemented in one of these FPGAs. The FPGA provider can sell these partially defective devices to the customer at a reduced price, as an alternative to discarding them.

However, in FPGAs most defects occur in the large CLB array that occupies the majority of the die. The CLBs are largely identical to each other, and each CLB can be programmed to perform any of a very large number of functions. Therefore, unless special steps are taken, it is virtually impossible to look at a user design and say with confidence that the implementation software will not use a given CLB to implement the design.

Further, when the design is implemented, the location of the defective CLBs is generally unknown, and is different for each defective device. Hence, when a single user design is targeted to a large number of defective PLDs (e.g., when a user wants to use defective PLDs in production to reduce the selling price of the end product), it can be very difficult to ensure that the implemented design will not impinge on defective locations in any of the targeted defective PLDs.

Cliff et al., in U.S. Pat. No. 5,434,514, and Reddy et al., in U.S. Pat. No. 6,201,404 describe two similar approaches to the problem of defective logic blocks in an FPGA. (Both of these patents are incorporated herein by reference.) According to Cliff and Reddy, an extra row (or column) of logic blocks is included in an FPGA. If one or more logic blocks in the central array are found to be defective during testing, the device is permanently programmed at the factory such that the row containing the defective logic blocks becomes transparent to the user. When the FPGA is programmed with the configuration bitstream, the defective row is bypassed, while the extra row is used as a replacement.

This method has the advantage that the same configuration data file is used for defective devices and fully functional devices. However, the method also has the drawback that the timing of the implemented design in a defective device can be significantly different from the timing of the same design in a fully functional device. The extra row of logic blocks and the supporting logic and routing also consume additional silicon area, increasing the cost of the FPGA (including those that are fully functional), and further increasing the likelihood of finding defects in the die.

Another method for handling fault tolerance is described by Hanchek and Dutt in "Node-Covering Based Defect and Fault Tolerance Methods for Increased Yield in FPGAs", Proceedings of the Ninth International Conference on VLSI Design, January 1996, which is incorporated herein by reference.

According to Hanchek's method, during the place and route process each primary CLB (node) in the FPGA is assigned a cover (i.e., replacement) CLB that can be reconfigured to replace the primary CLB if the primary CLB is defective in a particular target FPGA. The cover CLB of a particular primary CLB may be an unused CLB or another primary CLB, thereby forming a chain of primary/cover CLBs. A spare row (or column) of CLBs is provided for covering the last primary CLB in the row (or column). The FPGA routing software reserves the segments required to complete routes to the covering CLBs.

In a first approach, Hanchek alters the FPGA at the factory (e.g., by burning laser programmable links) such that the cover CLBs are used instead of the defective CLBs. In a second approach, non-volatile configuration bits on the FPGA (e.g., EEPROM memory cells) can be programmed by the user to use the cover CLBs. In either case, the same configuration data file is used for each defective and fully functional die. Also in either case, special circuitry must be included in the FPGA to accommodate the laser or EEPROM programming. The extra row or column of CLBs must also be included.

In U.S. Pat. No. 6,167,558, Trimberger describes a fault tolerance method superficially similar to Hanchek's method. (U.S. Pat. No. 6,167,558 is incorporated herein by reference.) However, Trimberger proposes altering the CLB design to facilitate shifting logic by one CLB down a row of CLBs, thus avoiding a defective CLB while having a minimal effect on design timing. Trimberger's method requires that special routing be included in the CLB to achieve this timing improvement.

While Trimberger's method has several advantages, when a user's design is implemented with the capability of using defective FPGAs, a number of "reserved resources" cannot be used to implement the design. Thus, the effective number of FPGA resources is reduced.

Logic indicates that the most efficient use of a PLD's resources is for all fully functional logic blocks to be available for implementing a user's design. One way to achieve this goal is to route the design separately for each defective PLD, avoiding all of the defective resources in that particular device, and to create a separate configuration data file for each PLD. In this case, clearly, the implementation software must have access to data pinpointing the locations of the defective logic blocks for the target PLD.

For example, an FPGA provider could supply a computer file with each defective device that pinpoints the defects for that particular device. A means for specifying resources to be "skipped" by the implementation software is already available for FPGAs. An FPGA "constraints file" can specify, for example, logic blocks (or portions thereof) in which the implementation software may not place any user logic. Thus, a corresponding constraints file could be shipped to a customer with each defective FPGA.

PLDs are sometimes used in small numbers during design development, when designs are frequently revised and re-implemented. In this type of situation, a single defective PLD could be used repeatedly, and an individualized defect data file would not be difficult to maintain for that PLD for a limited period of time.

However, where larger numbers of defective PLDs are used, maintaining the defect data files for each PLD could become a potential source of error over time. For example, the defect data file for each PLD would always have to be kept with the PLD, in case the user wanted to make changes to the design. Further, in order to take advantage of advances in the implementation software, the format of the defect data file would have to be altered periodically as the implementation software evolved. For example, the format of an FPGA constraints file for the Xilinx implementation software has altered significantly several times in the last decade, as new versions of the implementation software have been released.

Culbertson et al. describe maintaining a defect file for multiple FPGAs used in a computer system. (See "Defect Tolerance on the Teramac Custom Computer", Proceedings of the 5th Annual IEEE Symposium on Field-Programmable Custom Computing Machines, April 1997, Pp. 116–123, which is incorporated herein by reference.) Various user designs are mapped into the computer system, and the defect file ensures that the defective portions of the various FPGAs within the system are not used when the designs are mapped.

Culbertson et al. created a defect list for a single system, and implemented many different user designs in the system. Therefore, the situation described by Culbertson et al. is analogous to that of mapping a customer design to a single PLD having multiple defects, rather than to the present situation, where the goal is to map a single user design many times, to each of several PLDs having defects in different locations.

Another drawback of the methods taught by Cliff and Reddy is the need to avoid relatively large logic blocks that contain defects, even if there is only a single small defect in the logic block. This situation arises because the defect avoidance information and logic are on the chip, and there is limited space on the chip to store the information and avoid the defects. This limitation leads to large redundant areas, resulting in poor efficiency. In contrast, the method of Culbertson can identify a very small defect to be avoided, because the data identifying the defect is not stored on the chip.

However, according to Culbertson's method a user must manage all the data of all the chips in use. In Culbertson's case this was not a serious issue, because multiple user designs were mapped to the same PLDs, and the defect information was unchanged and re-used for each user design. However, in a system production environment, the defect information is used only once for each PLD, and new defect information is needed for each PLD. PLD providers must provide all the relevant data on defective dice to users, and should avoid sending information on defective dice that are shipped to other users. The PLD provider must track which users have which PLDs. The users must manage an inventory of defect information, much of which quickly becomes obsolete, but must be stored in case of eventual need.

Therefore, it is desirable to provide methods enabling the efficient implementation of a single user design in multiple defective PLDs, in order to maximize resource usage in these defective PLDs while minimizing user effort.

SUMMARY OF THE INVENTION

The invention provides methods for utilizing PLDs with localized defects, each PLD having a unique identifier. According to a first aspect of the invention, a PLD provider tests a series of PLDs, selecting those having localized defects (as opposed to those that are fully functional or those having gross defects that render the PLD unusable). Defect data is recorded for each defective PLD, including the identifier for each PLD and the location of each detected defect. The defect data is stored in a database. When an identifier is received from a user, the PLD provider provides in response the location information for the defects associated with the identified PLD.

In one embodiment, the identification information is received, and the location information is provided, over a data communications link such as the Internet. In one embodiment the location information is stored in the form of logic block identifiers, e.g., a notation of which logic blocks (or portions thereof) are defective. In another embodiment, the location information is stored in the form of numerical coordinates identifying the position of each defect. In another embodiment, where the PLD is an FPGA, the PLD provider generates a defect map for each defective FGPA. From the defect map, a constraints file is created that prevents the placement of logic in the defective portions of the FPGA.

According to a second aspect of the invention, a user provides to a PLD provider a unique identifier corresponding to a defective PLD. In response, the user receives defect data from the PLD provider, including location information for the defects associated with the identified PLD. The user then implements a design in the defective PLD, using the location information to prevent the usage of the defective portions of the PLD.

In one embodiment, the user also implements the design in a fully functional PLD. In other words, the user generates a first implemented design, but may or may not actually configure a device with the resulting design file. In this embodiment, the user implements the design in the defective PLD by performing an incremental compilation. The first implemented design is used as a template, while changing the design only as much as necessary to avoid the defects in the defective PLD.

In another embodiment, the user implements the same design in two different defective PLDs. In one such embodiment, the first user design (in the first defective PLD) is used as the basis for an incremental compilation for the second defective PLD.

In one embodiment, in which the PLD is an FPGA programmable from a PROM, the design is implemented by a PROM programmer using PROM programming software. In another embodiment, in which the PLD is also an FPGA, the design is implemented by standard FPGA place and route software, followed by generating a corresponding FPGA bitstream. This software is readily available, for example, for PCs and engineering workstations.

According to a third aspect of the invention, a PLD provider implements the design and supplies the resulting design file to the PLD user. In one such embodiment, the user generates a first design file for a fully functional device and provides it to the PLD provider. On receiving an identifier for a defective PLD, the PLD provider implements the design for the identified PLD. In doing so, the PLD provider performs an incremental compilation based on the first design file and using the recorded defect location data to avoid the defective areas in the identified PLD.

According to a fourth aspect of the invention, the methods of the invention are applied to device-specific information other than defect locations. For example, in one embodiment the PLD provider maintains a database recording the speed of critical sub-components of the PLD. In another embodiment, the recorded data includes optimal configuration settings for each PLD.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 1:
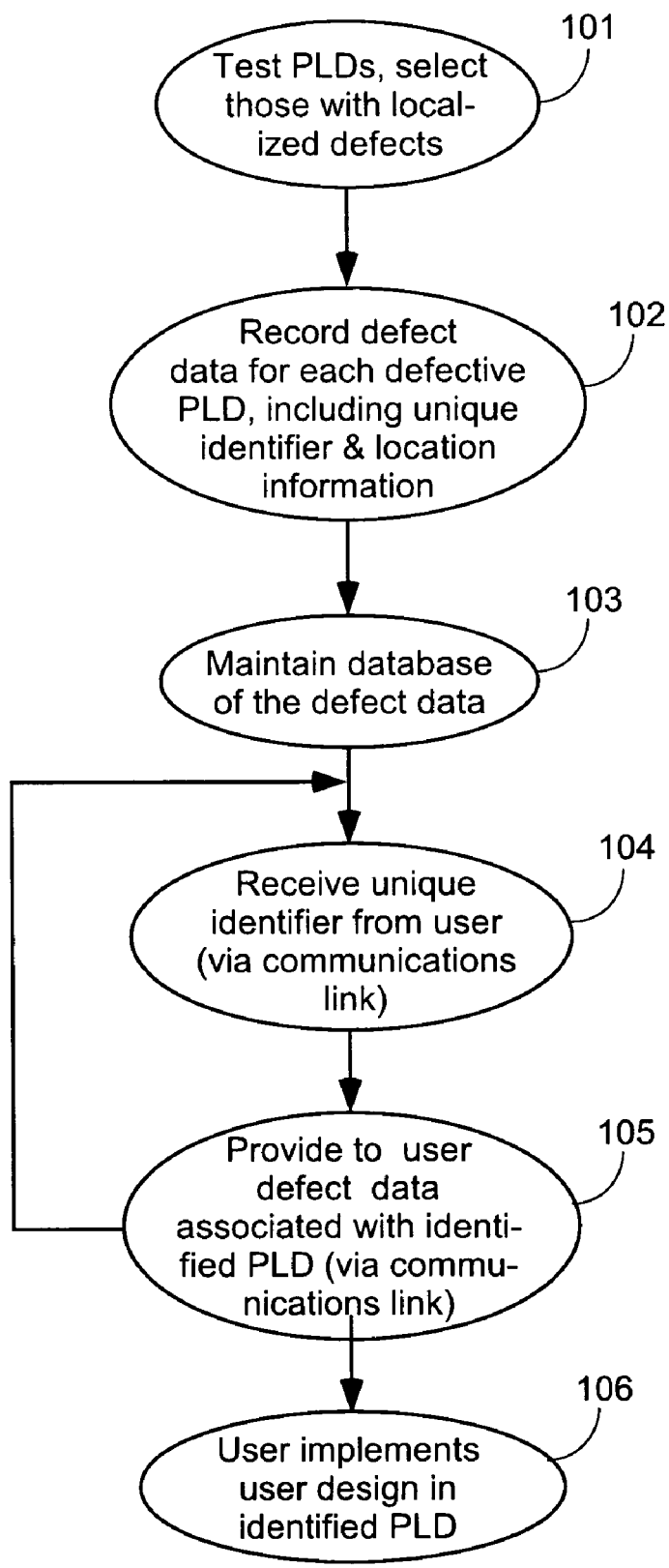
FIG. 1 illustrates a method of providing defect data for defective PLDs.

FIG. 1 shows a method by which defect data is provided to users by a PLD provider. Most of the illustrated steps (101–105) are performed by the PLD provider. Step 106 is performed by the user.

In step 101, the PLD provider tests a group of PLDs and selects from the group those PLDs having localized defects. For example, a PLD provider can group the PLDs into those that are fully functional (including meeting specified timing requirements), non-functional PLDs (those having gross defects, which are discarded), and those having localized defects (which can still be used if the areas of the localized defects are avoided).

In step 102, defect data is recorded for each defective PLD, i.e., for each PLD with only localized defects, those with gross defects having already been discarded. The defect data identifies each defective PLD using the unique identifier included in the PLD. (The use of unique identifiers for integrated circuits is well known in the art.) The defect data also includes, for each identified PLD, a record of the locations of all detected defects.

The location information can be stored in coordinate form, for example, or by identifying each defective logic block or portion thereof. For example, for an FPGA, if only the flip-flop in a particular CLB is defective, the flip-flop can be recorded as defective without inhibiting the use of the corresponding function generator in the same CLB.

In one embodiment where the PLD is an FPGA, the location information is recorded as a defect map, which is then translated into a constraints file for the FPGA. The constraints file is written in a format that can be read and interpreted by the FPGA implementation software. Such constraints files are well known.

In step 103, the PLD provider maintains a database of the defect data recorded in step 102. In step 104, the PLD provider receives from a user a unique identifier corresponding to a defective PLD. The identifier can be received, for example, over a data communications link such as the Internet.

The term "data communications link" as used herein includes but is not limited to the Internet, intranets, Wide Area Networks (WANs), Local Area Networks (LANs), and transducer links such as those using Modulator-Demodulators (modems). The term "Internet" as used herein refers to a wide area data communications network, typically accessible by any user having appropriate software. The term "intranet" as used herein refers to a data communications network similar to the Internet but typically having access restricted to a specific group of individuals, organizations, or computers. A data communications link may be a wired network, a wireless network connected, for example, by radio or satellite communications, or a combination network.

In step 105, the PLD provider provides to the user from the database the location information for the defects associated with the identified defective PLD. The location information can also be provided, for example, over the same data communications link over which the unique identifier was received.

In step 106, the user implements the user design in the identified PLD, using the location information provided by the PLD provider to avoid implementing logic in the defective locations.

As shown by the arrow from step 105 back to step 104, the PLD provider can also receive additional unique identifiers from the user and provide the corresponding defect data, and the user can implement the same user design in the corresponding additional defective PLDs.

The steps of FIG. 1 need not all be performed in the order shown. For example, the PLD provider can provide location information for many defective PLDs before or after the user implements the user design in any of the PLDs.

Figure 2:
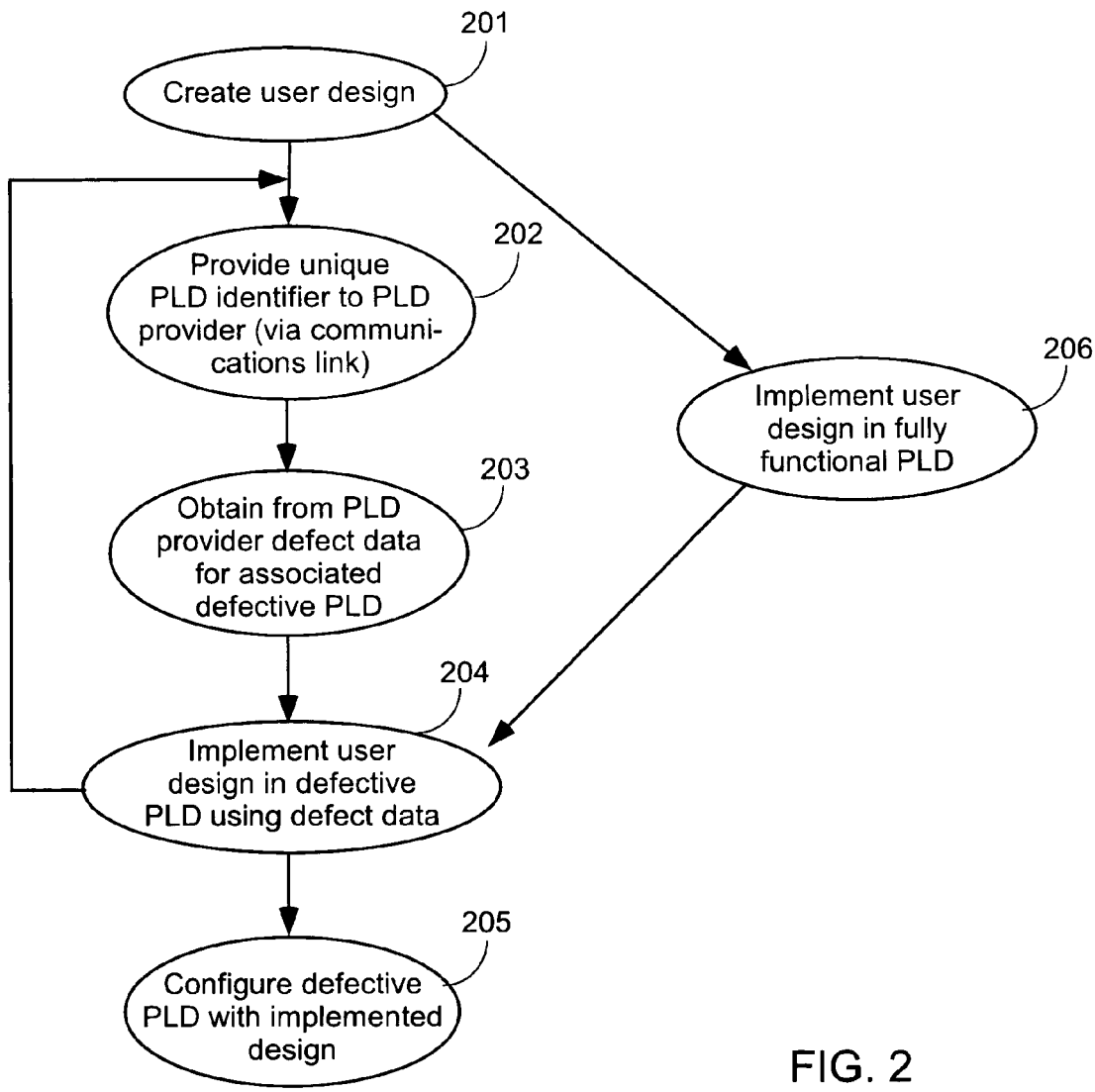
FIG. 2 illustrates a method of implementing a user design in a defective PLD.

FIG. 2 shows a method of implementing a user design in a defective PLD. The illustrated steps are performed by the PLD user.

In step 201, the user creates a user design. A user can create a design, for example, using either schematic entry, where components are explicitly identified for placement in the design, or in a high-level design language (HDL), where the behavior of the circuit is described and synthesis software is used to identify components to be used in the circuit implementation.

In step 202, the user provides to the PLD provider a unique identifier associated with a defective PLD (usually previously purchased from the PLD provider). In one embodiment, this step is performed via a data communications link.

In response, in step 203 the user receives from the PLD provider the defect data for the identified defective PLD. In one embodiment, the defect data includes location information in coordinate form. In another embodiment, the defect data includes location information for the defective logic blocks or portions thereof. In another, the defect data is in the form of a constraints file.

In step 204, the user implements the user design in the identified defective PLD using the associated defect data. In one embodiment, the user has previously implemented the user design in a fully functional PLD (shown in optional step 206). In this embodiment, the user implements the user design by performing an incremental compilation based on the fully functional design. In this incremental compilation, changes from the fully functional design are limited to those required to avoid the localized defects. Incremental compilation is well known in the art of PLD implementation software.

In one embodiment where the PLD is an FPGA, the compilation step is performed using place and route software. In one such embodiment, the location information is provided in the form of a constraints file that can be read and interpreted by the place and route software. In another embodiment, where the FPGA is configured from a PROM, the compilation step is performed using PROM programming software.

In step 205, the user configures the identified defective PLD with the implemented design. As shown by the arrow feeding back from step 204 (which could equally well be feeding back from steps 202, 203, or 205), the user can also provide additional unique identifiers to the PLD provider, receive the associated defect data, and implement the user design in the corresponding additional defective PLDs. These additional implementations can also, if desired, be generated using incremental compilation.

Figure 3:
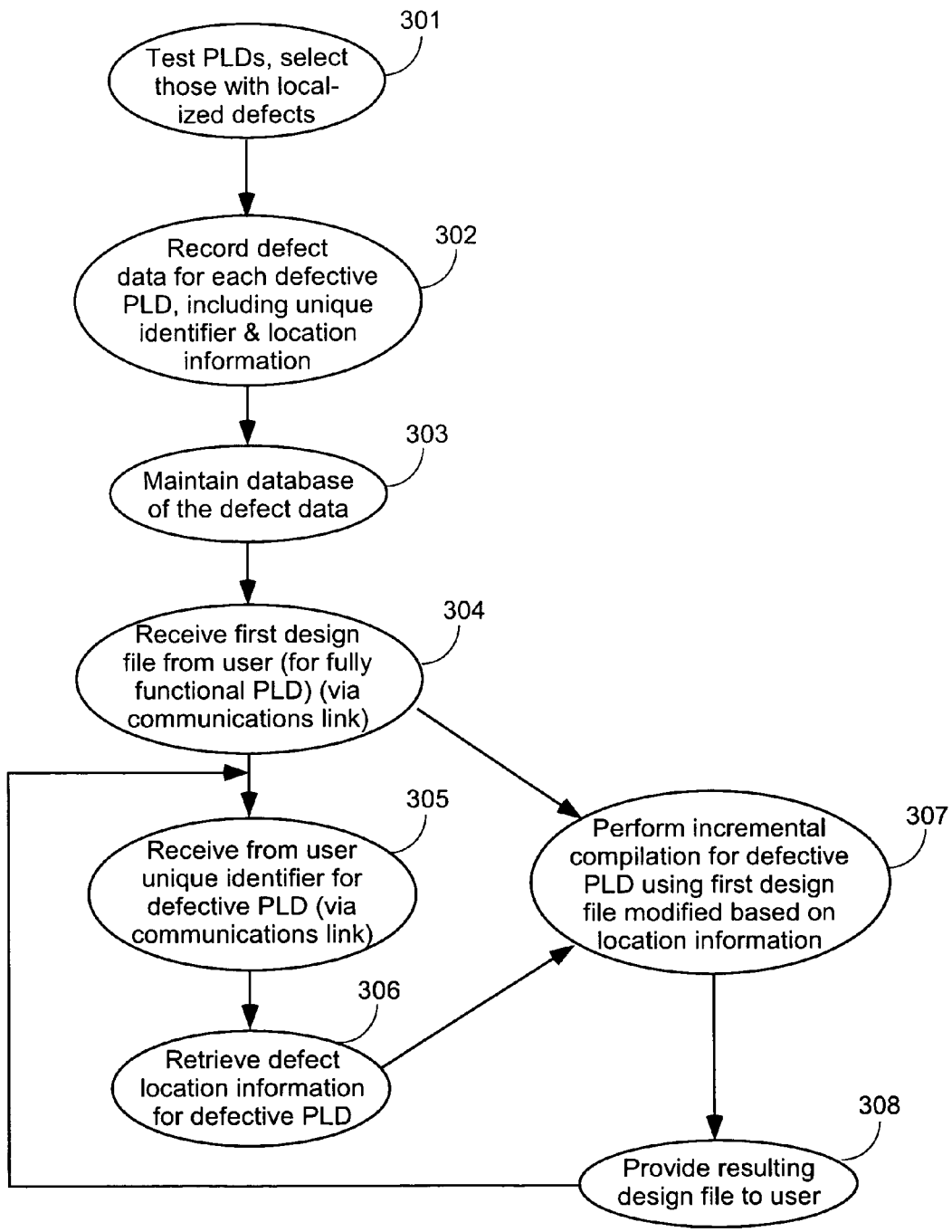
FIG. 3 illustrates a method of providing custom design files for defective PLDs.

FIG. 3 shows a method by which custom design files are provided to users by a PLD provider. All of the illustrated steps are performed by the PLD provider.

In step 301, the PLD provider tests a group of PLDs and selects from the group those PLD having localized defects. In step 302, defect data is recorded for each defective PLD. In step 303, the PLD provider maintains a database of the defect data recorded in step 302.

In step 304, the PLD provider receives from a user a first design file, an implementation of a user design that is already implemented in a fully functional PLD. This design file is later used (step 307) as the basis for an incremental compilation while implementing the user design in a defective PLD.

In step 305, the PLD provider receives from the user a unique identifier corresponding to a defective PLD. The identifier can be received, for example, over a data communications link such as the Internet.

In step 306, the PLD provider retrieves from the database the location information for the defects associated with the identified defective PLD.

In step 307, the PLD provider implements the user design in the identified PLD, performing an incremental compilation based on the first design file and using the location information retrieved from the database to avoid implementing logic in the defective locations.

In step 308, the PLD provider provides to the user the design file resulting from step 307.

As shown by the arrow from step 308 back to step 305 (which could equally well be feeding back from steps 305, 306, or 307), the PLD provider can also receive additional unique identifiers from the user, retrieve the corresponding defect data, implement the user design in the corresponding defective PLDs based on the first design file and the retrieved defect data, and provide the resulting design files to the user.

The methods of the invention need not be restricted to defect information for defective PLDs. Similar methods can also be applied to any PLDs (including fully functional PLDs) having characteristics that vary for each PLD. For example, methods similar to those shown in FIGS. 1–3 can be used to store and provide information relating to the speed of various sub-components. These sub-components can be faster in some PLDs than in others, due to processing variations. For example, in devices having otherwise similar timing, a variation in the polysilicon layer can alter the speed of signal propagation in that layer. Thus, any sub-components that use polysilicon structures to distribute internal signals (e.g., sub-structures including resistor elements) will operate more slowly than other sub-components in the same PLD.

As another example, special configuration information can be stored for each PLD or set of PLDs. For example, a PLD can include in the configuration data file provision for specifying certain settings that can be specific to each device. These settings can be used, for example, to provide a default configuration preamble to explicitly clear a PLD configuration to avoid a possible high-current state due to mis-processing of a wafer or a set of wafers. These settings can also be used to set input delay values in the bitstream on a per-PLD basis to optimize performance without requiring non-volatile memory on the PLD to store that information.

Figure 4:
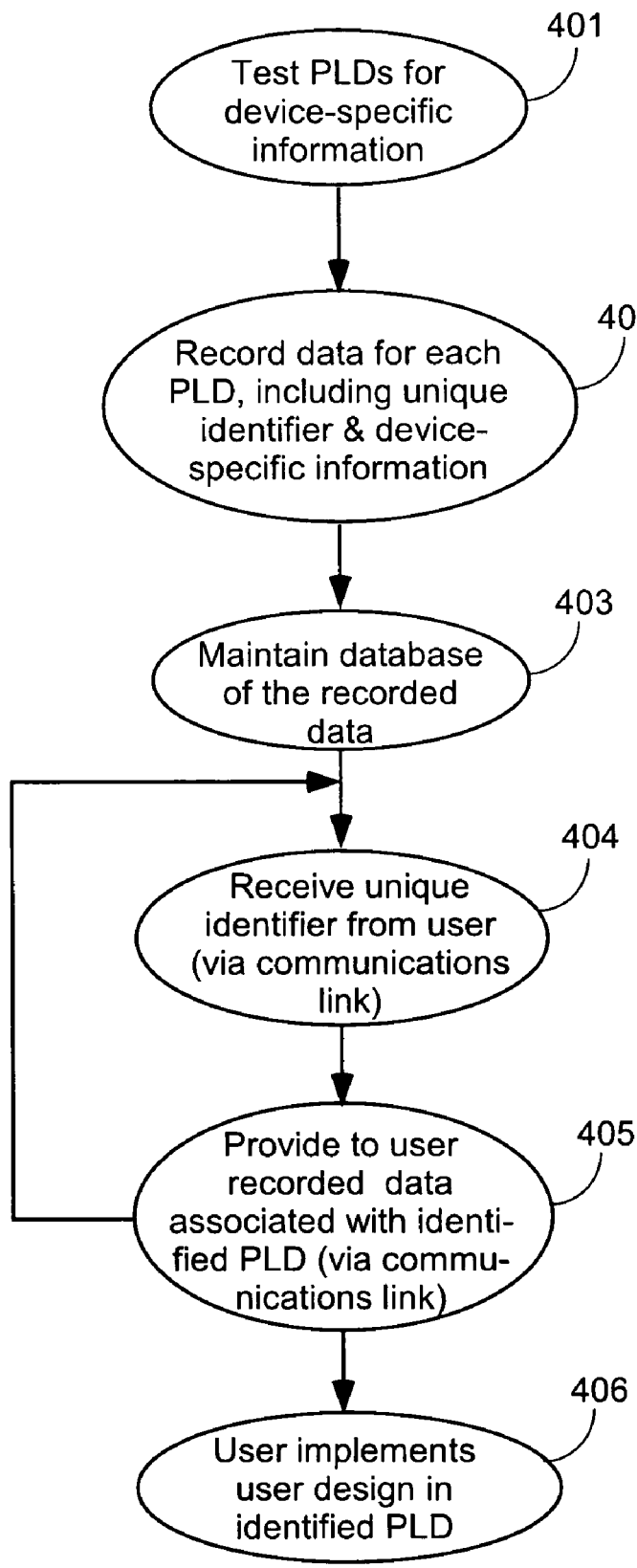
FIG. 4 illustrates a method of providing device-specific data for uniquely-identified PLDs.

FIG. 4 shows a method by which device-specific data is provided to users by a PLD provider. Most of the illustrated steps (401–405) are performed by the PLD provider. Step 406 is performed by the user.

In step 401, the PLD provider tests a group of PLDs for device-specific information. In step 402, data is recorded for each PLD. The recorded data identifies each PLD using the unique identifier included in the PLD. The recorded data also includes, for each identified PLD, the device-specific information determined in step 401.

In step 403, the PLD provider maintains a database of the data recorded in step 402. In step 404, the PLD provider receives from a user a unique identifier corresponding to one of the tested PLDs. The identifier can be received, for example, over a data communications link such as the Internet.

In step 405, the PLD provider provides to the user from the database the device-specific data associated with the identified PLD. The device-specific data can also be provided, for example, over the same data communications link over which the unique identifier was received. In step 406, the user implements the user design in the identified PLD, using the device-specific data provided by the PLD provider.

As shown by the arrow from step 405 back to step 404, the PLD provider can also receive additional unique identifiers from the user and provide the corresponding data, and the user can implement the same user design in the corresponding additional PLDs. Additionally, the steps of FIG. 4 need not all be performed in the order shown. For example, the PLD provider can provide device-specific data for many PLDs before or after the user implements the user design in any of the PLDs.

Figure 5:
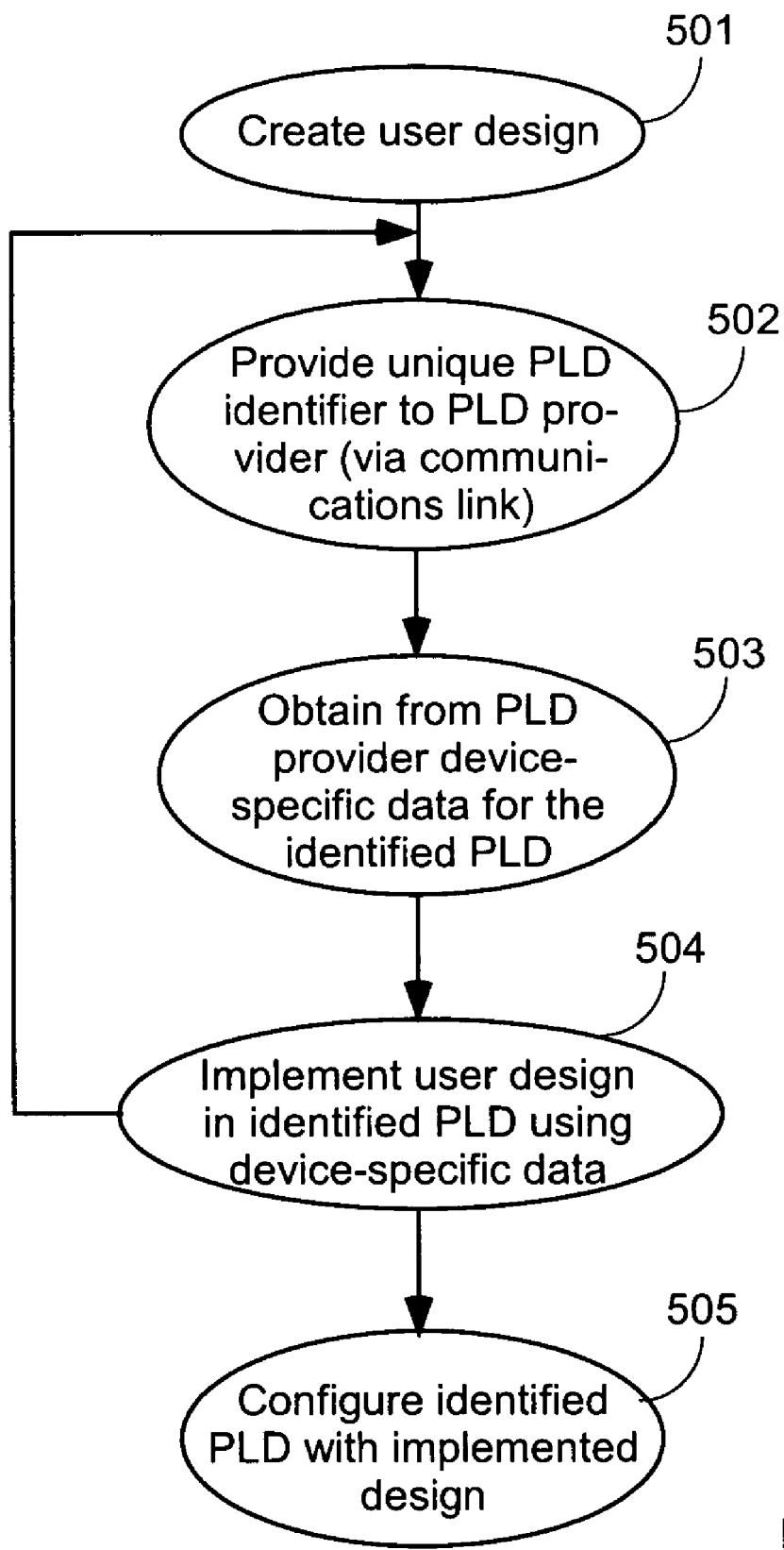
FIG. 5 illustrates a method of implementing a user design in a uniquely-identified PLD using device-specific data.

FIG. 5 shows a method of implementing a user design in a uniquely-identified PLD using device-specific data supplied by a PLD provider. The illustrated steps are performed by the PLD user.

In step 501, the user creates a user design. In step 502, the user provides to the PLD provider a unique identifier associated with a given PLD (usually previously purchased from the PLD provider). In one embodiment, this step is performed via a data communications link.

In response, in step 503 the user receives from the PLD provider the associated device-specific data for the identified PLD. In step 504, the user implements the user design in the identified PLD using the device-specific data. In step 505, the user configures the identified PLD with the implemented design.

As shown by the arrow feeding back from step 504 (which could equally well be feeding back from steps 502, 503, or 505), the user can also provide additional unique identifiers to the PLD provider, receive the associated device-specific data, and implement the user design in the corresponding additional PLDs.

Other applications and variations of these methods will become apparent to one of ordinary skill in the art on review of the material presented herein. For example, the methods of the invention can be used to avoid logic errors in the design of a PLD until a new version of the PLD becomes available that fixes the logic error. As another example, the methods of the invention can be used to enable the modification of a design intended for one kind of PLD such that the design can be loaded into a different kind of PLD. This ability allows a user to use two or more different kinds of PLDs to perform the same function in a system. In both of these examples, the individual PLD need not be uniquely identified, only its membership in a set. Thus, the set of PLDs is uniquely identified, rather than the individual PLD.

The methods of the present invention can be performed in either hardware, software, or any combination thereof, as those terms are currently known in the art. In particular, the present method may be carried out by software, firmware, or microcode operating on a computer or computers of any type. Additionally, software embodying the present invention may comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Further, such software can also be in the form of a computer data signal embodied in a carrier wave, such as that found within the well-known Web pages transferred among computers connected to the Internet. Accordingly, the present invention is not limited to any particular platform, unless specifically stated otherwise in the present disclosure.

What is claimed is:

1. A method of providing custom design files for programmable logic devices (PLDs), the PLDs each having a unique identifier, the method comprising:

testing a plurality of the PLDs and selecting therefrom a plurality of defective PLDs containing localized defects;

recording defect data for each defective PLD, the defect data comprising the unique identifier for each defective PLD and location information for each detected defect within the defective PLD;

maintaining a database of the defect data;

receiving a first design file from a user, the design file being an implementation targeted towards a fully functional version of the defective PLDs;

receiving a first identifier from the user uniquely identifying a first defective PLD of the plurality of defective PLDs;

retrieving from the database, based on the first identifier, first location information for the first defective PLD;

performing an incremental compilation with respect to the first design file while using the first location information to avoid the localized defects of the first defective PLD, the incremental compilation generating a second design file; and providing the second design file to the user.

2. The method of claim 1, wherein:

receiving the first identifier from the user is accomplished via a data communications link; and providing the second design file to the user is accomplished via the data communications link.

3. The method of claim 1, further comprising:

receiving a second identifier from the user uniquely identifying a second defective PLD of the plurality of defective PLDs;

retrieving from the database, based on the second identifier, second location information for the second defective PLD;

performing a second incremental compilation with respect to the first design file while using the second location information to avoid the localized defects of the second defective PLD, the second incremental compilation generating a third design file; and providing the third design file to the user.

4. The method of claim 1, wherein the PLD is a field programmable gate array (FPGA).

5. The method of claim 4, wherein maintaining the database of the defect data comprises:

generating a defect map for each defective PLD; and generating a constraints file for each defective PLD based on a corresponding defect map, and wherein performing an incremental compilation with respect to the first design file comprises using the constraints file corresponding to the first defective PLD.

6. A method of providing design files for programmable logic devices (PLDs), the method comprising:

establishing a database of defect data for a plurality of defective PLDs, the defect data including a unique identifier for each defective PLD in association with location information for each defect within the defective PLD;

receiving a first design file from a user, the design file being an implementation targeted to a non-defective PLD;

receiving from the user a first identifier that uniquely identifies a first defective PLD of the plurality of defective PLDs;

retrieving from the database, based on the first identifier, first location information for the first defective PLD;

performing an incremental compilation of the first design file while using the first location information to avoid each defect of the first defective PLD, the incremental compilation generating a second design file; and providing the second design file to the user.

7. The method of claim 6, further comprising:

receiving from the user a second identifier that uniquely identifies a second defective PLD of the plurality of defective PLDs;

retrieving from the database, based on the second identifier, second location information for the second defective PLD;

performing a second incremental compilation of the first design file while using the second location information to avoid each defect of the second defective PLD, the second incremental compilation generating a third design file; and providing the third design file to the user.

8. The method of claim 6, wherein the PLD is a field programmable gate array (FPGA).

9. The method of claim 8, wherein maintaining the database of the defect data comprises:

generating a defect map for each defective PLD; and generating a constraints file for each defective PLD based on a corresponding defect map, and wherein performing an incremental compilation of the first design file comprises using the constraints file corresponding to the first defective PLD.

* * * * *